(12) United States Patent
Kuo

(10) Patent No.: US 6,275,384 B1
(45) Date of Patent: Aug. 14, 2001

(54) ELECTRICAL TRANSITION DEVICE WITH IMPROVED LED POSITIONING MEANS

(75) Inventor: Peter Kuo, Chungo-Ho (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/378,615

(22) Filed: Aug. 20, 1999

(30) Foreign Application Priority Data

Oct. 17, 1998 (TW) .................................................. 87217151

(51) Int. Cl.⁷ ....................................................... H05K 5/00
(52) U.S. Cl. ........................ 361/752; 361/825; 174/138 G
(58) Field of Search ........................... 174/138 G, 138 B, 174/138 J; 361/772–774, 806, 807, 808, 767, 742, 770, 825, 828

(56) References Cited

U.S. PATENT DOCUMENTS 5,426,265 * 6/1995 Savage, Jr. ........................ 174/138 G

* cited by examiner

Primary Examiner—Jeffrey Gaffin
Assistant Examiner—Phuong T. Vu
(74) Attorney, Agent, or Firm—Wei Te Chung

(57) ABSTRACT

An electrical transition device includes a cover unit, a printed circuit board received in the cover unit, an electronic component mounted on the printed circuit board. The electronic component has a body and a pair of electrode tails extending from a bottom surface of the body. A support member is positioned between the body of the electronic component and the printed circuit board. The support member forms a pair of slots extending along a longitudinal surface thereof for receiving the electrode tails of the electronic component.

7 Claims, 5 Drawing Sheets

ELECTRICAL TRANSITION DEVICE WITH IMPROVED LED POSITIONING MEANS

BACKGROUND OF THE INVENTION

1. Field of the Invention

The present invention relates to an electrical transition device, and particularly to an electrical transition device having an improved LED positioning means.

2. Description of the Prior Art

Referring to FIGS. 4 and 5, a conventional electrical transition device 1 related to the present invention substantially includes a cover unit 11, a printed circuit board (PCB) 12 received in the cover unit 11 and electronic components 13 mounted on the PCB 12. Each electronic component 13 includes two electrode tails 131 for being soldered to the PCB 12. However, since the electrode tails 131 are thin and long, properly positioning and mounting the electronic components 13 become difficulty. The result may be that the electrode tails 131 are deformed or the electronic component 13 extend out of the shell 11.

SUMMARY OF THE INVENTION

Accordingly, an object of the present invention is to provide an electrical transition device having a support member for facilitating properly positioning and mounting electronic components on a PCB.

In order to achieve the object set forth, an electrical transition device in accordance with the present invention comprises a cover unit, a printed circuit board received in the cover unit and an electronic component mounted on the printed circuit board. The electronic component has a body portion and a plurality of electrode tails extending from a bottom surface of the body. A support member is secured between the electrode tails of the electronic component at one end, and positioned between the body of the electronic component and the printed circuit board at the other end, thereby facilitating proper positioning and mounting of the electrical component on the PCB.

BRIEF DESCRIPTION OF THE DRAWINGS

Other objects and advantages of the present invention will be understood from the following description of an electrical transition device according to a preferred embodiment of the present invention shown in the accompanying drawings, in which.

DETAILED DESCRIPTION OF THE PREFERRED EMBODIMENT

Figure 1:
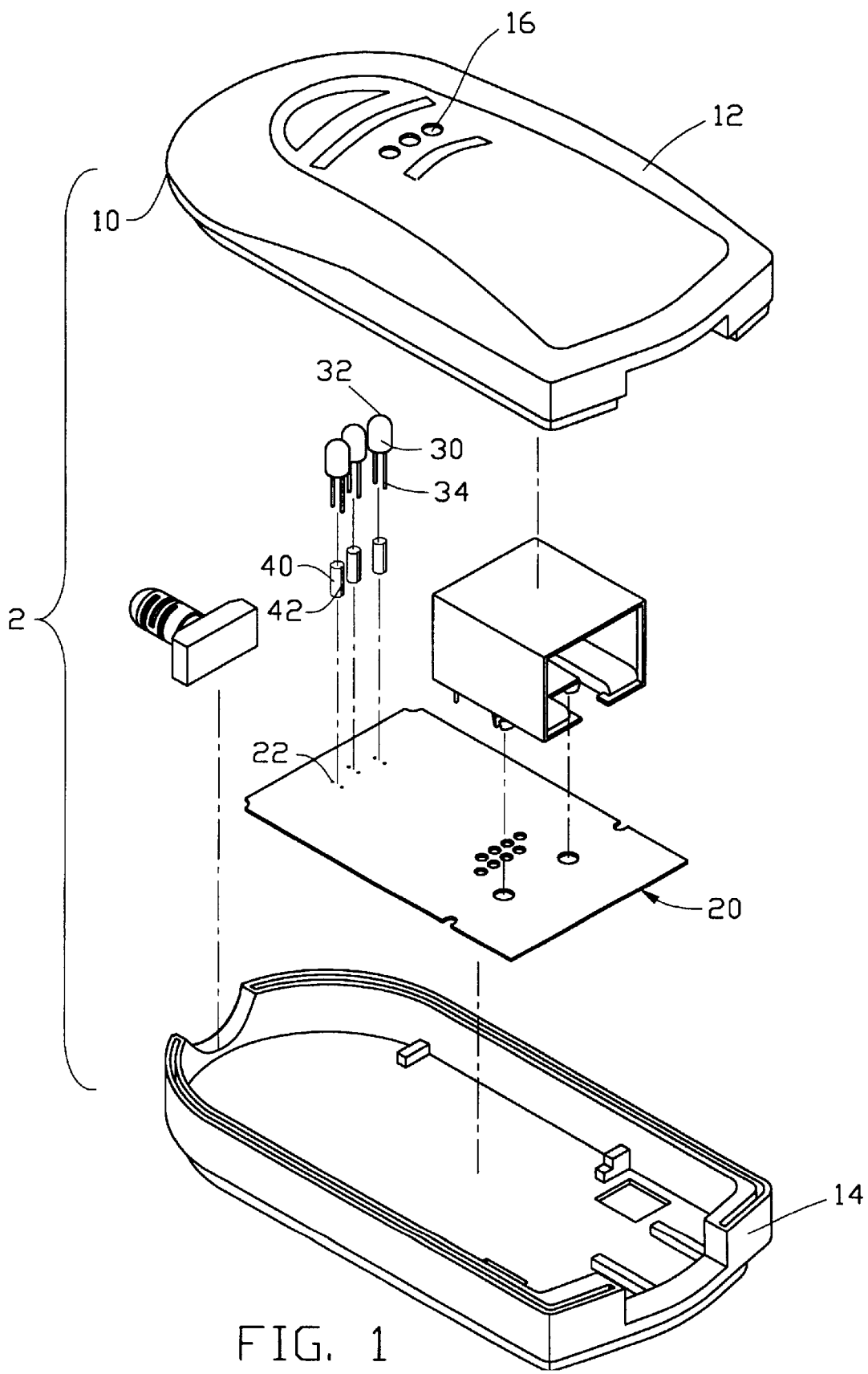
FIG. 1 is an exploded view of an electrical transition device embodying the concepts of the present invention.
Figure 2:
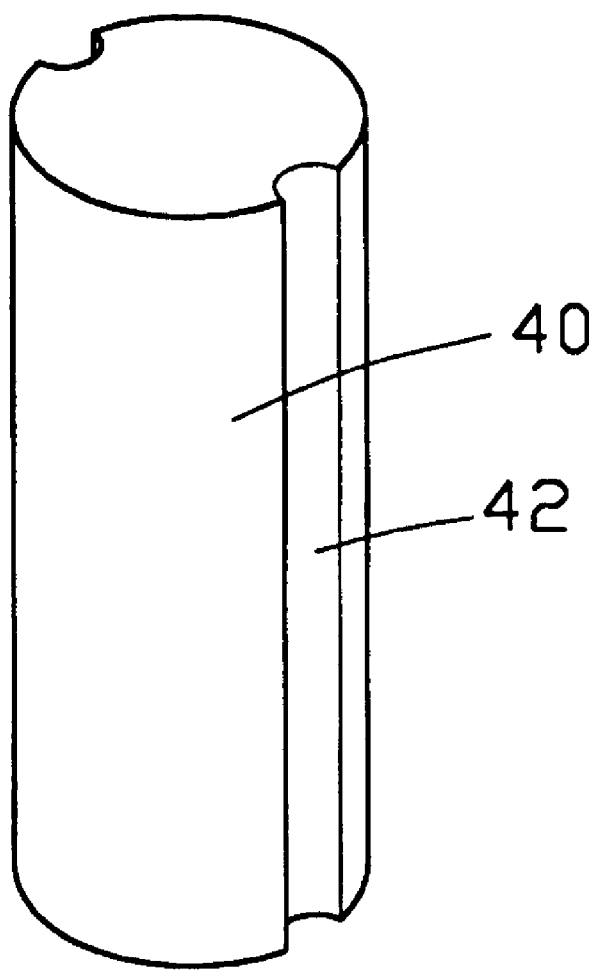
FIG. 2 is a perspective view of a support member of the present invention.

Referring to FIGS. 1 and 2, an electrical transition device 2 in accordance with the present invention comprises a cover unit 10, a printed circuit board (PCB) 20 received in the cover unit 10, three electronic components 30 assembled on the PCB 20 and three support members 40 assembled to the corresponding electronic components 30. The cover unit 10 includes a top cover 12 and a bottom cover 14 attached together. The top cover 12 forms three global holes 16 of which each has a part of global inner surface.

The PCB 20 forms three pairs of slots 22 proximate one end thereof. Each electronic component 30 has a body 32 and a LED comprising a pair of parallel electrode tails 34 extending from a bottom surface of the body 32 for insertion in the corresponding slots 22 of the PCB 20. Each body 32 has a rounded top surface to abut against the corresponding global hole 16 of the top cover 12 thereby preventing the electronic components 30 from extending out of the top cover 12. Each support member 40 is a resilient column and forms a pair of longitudinal arcuate slots 42 along a peripheral surface thereof. The slots 42 are configured for receiving the electrode tails 34 of the corresponding electronic component 30. A height of the support members 40 is predetermined to be slightly less than the length of the electrode tails 34.

Figure 3:
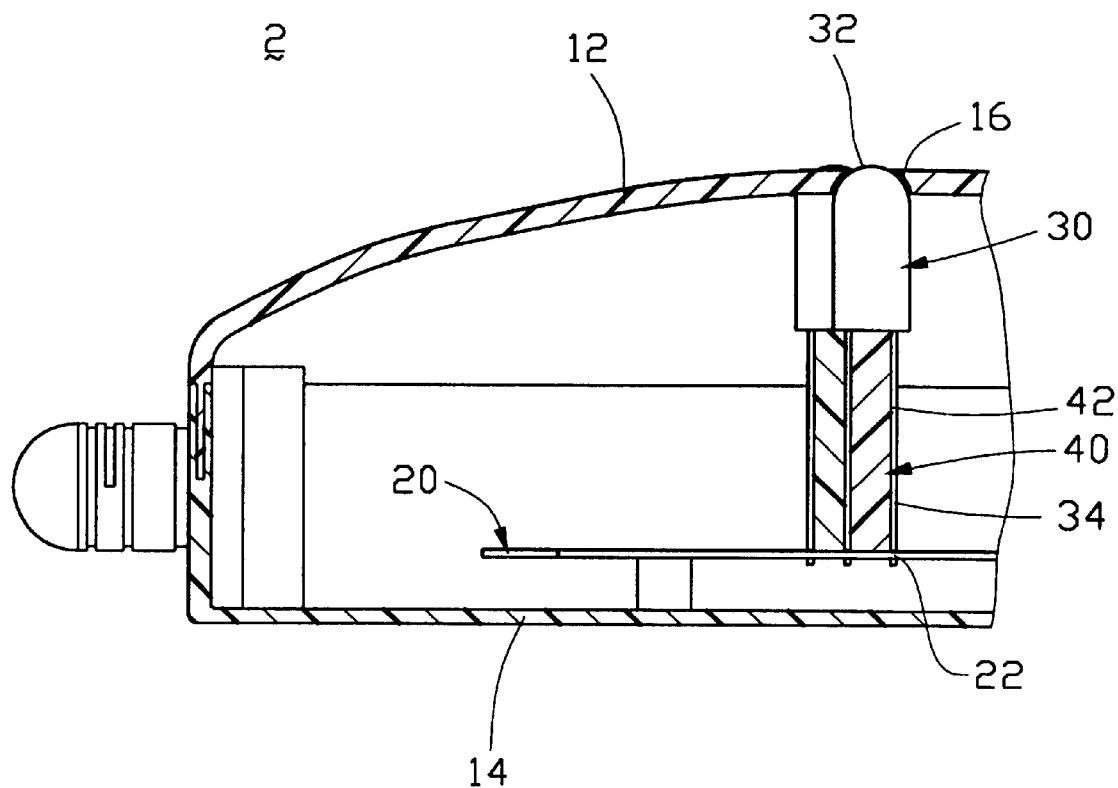
FIG. 3 is a partial cross-sectional view of the assembled electrical transition device.
Figure 4:
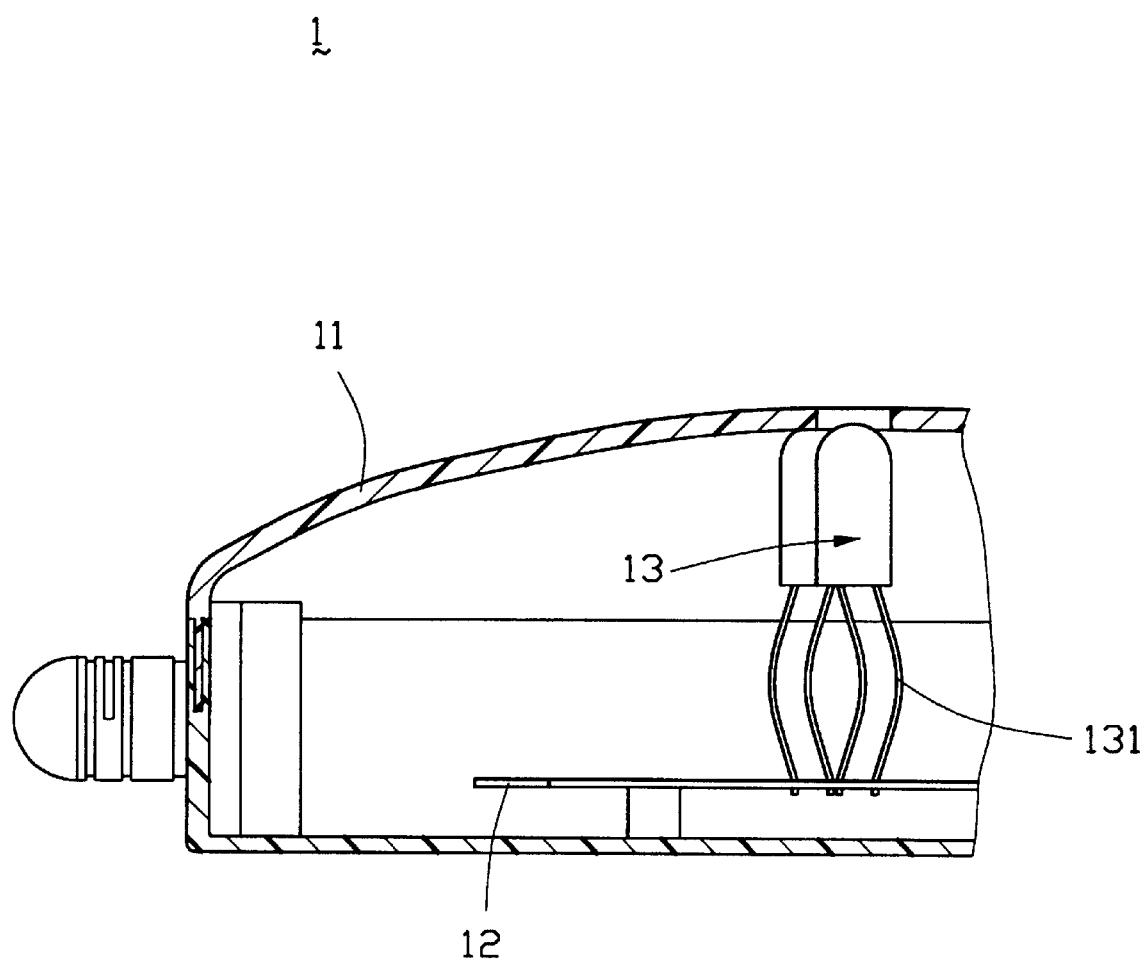
FIG. 4 is a partial cross-sectional view of a conventional electrical transition device.
Figure 5:
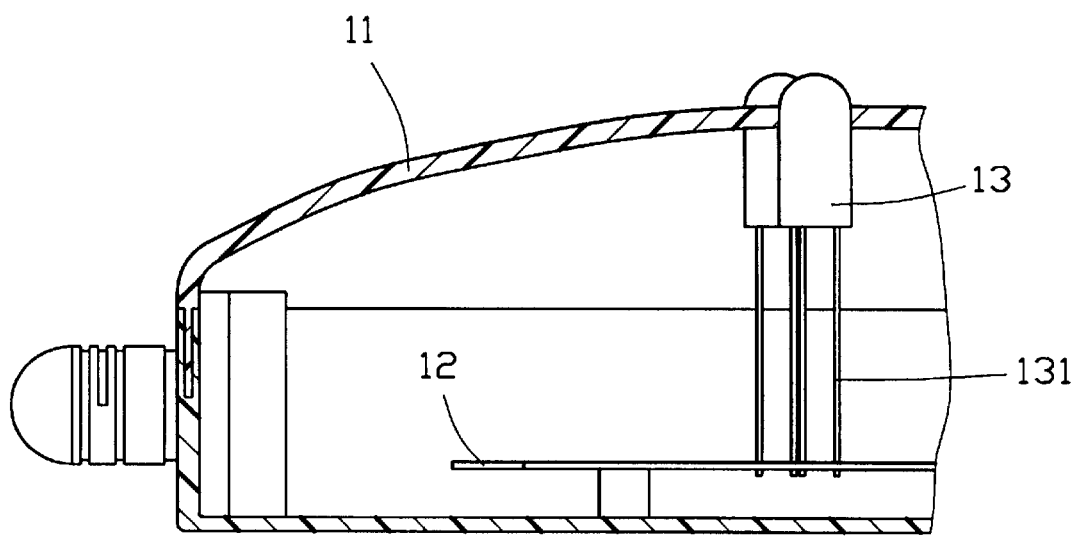
FIG. 5 is a partial cross-sectional view of another conventional electrical transition device.

Referring now to FIG. 3, in assembly, the electrode tails 34 of each electronic component 30 are received in the corresponding slots 42 of each support member 40 and extend through the corresponding slots 22 of the PCB 20. The support member 40 is secured between the electrode tails 34 of the electronic component 30 with one end thereof abutting against the bottom surface of the body 32 of the electronic component 30 and the other end thereof abutting against the PCB 20. Thus, the support member 40 promotes properly positioning and mounting of the electronic components 30 on the PCB 20. Furthermore, due to the resiliency of the support member 40, the electrode tails 34 of the electronic components 30 can easily resume their original shape after being bent.

It will be understood that the present invention may be embodied in other specific forms without departing from the spirit of the central characteristics thereof. The present examples and embodiments, therefore, are to be considered in all respects as illustrative and not restrictive, and the invention is not to be limited to the details given herein.

What is claimed is:

1. An electrical transition device comprising:

a cover unit;

a printed circuit board received in the cover unit;

an electrical component mounted on the printed circuit board (PCB), the electronic component having a body and a plurality of electrode tails extending from a bottom surface of the body; and a support member secured between the electrode tails of the electronic component, and positioned between the body of the electronic component and the printed circuit board, thereby facilitating proper positioning and mounting of the electronic component on the PCB, wherein the support member forms a plurality of longitudinal slots extending along a peripheral surface thereof for receiving corresponding electrode tails of the electronic component.

2. The electrical transition device as described in claim 1, wherein the body of the electronic component has a rounded top surface, and wherein the cover unit forms a global hole for partially receiving a portion of the top surface of the body.

3. The electrical transition device as described in claim 1, wherein the support member is elongate, the one end thereof abutting against the bottom surface of the body of the electronic component and the other end thereof abutting against the PCB.

4. The electrical transition device as described in claim 1, wherein the support member is resilient for facilitating resuming the original shape of the electrode tails of the electronic component after the electrode tails being bent.

5. The electrical transition device as described in claim 1, wherein the electronic component comprises a LED having a pair of electrode tails, and wherein the support member includes a pair of slots for receiving the pair of electrode tails.

6. An electrical assembly comprising:

a printed circuit board defining at least a pair of holes;

at least an electronic component positioned on the circuit board and including a body with a pair of electrode tails extending downward therefrom; and a resilient support member positioned between said electronic component and the circuit board, said support member further including means protectively grasping the corresponding electronic tails for alignment with the corresponding holes, respectively; wherein said support member does not exceed the tails in corresponding radial directions.

7. The assembly as described in claim 6, wherein said support member defines two opposite ends respectively abutting against the body of the electronic component and the circuit board.

* * * * *